(12) United States Patent
Pan et al.

(10) Patent No.: US 8,217,417 B2
(45) Date of Patent: Jul. 10, 2012

(54) ANTISTATIC GALLIUM NITRIDE BASED LIGHT EMITTING DEVICE AND METHOD FOR FABRICATING THE SAME

(75) Inventors: Qunfeng Pan, Xiamen (CN); Xuejiao Lin, Xiamen (CN); Jyh Chiarng Wu, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 129 days.

(21) Appl. No.: 12/876,833

(22) Filed: Sep. 7, 2010

(65) Prior Publication Data

US 2011/0057199 A1    Mar. 10, 2011

(30) Foreign Application Priority Data

Sep. 8, 2009   (CN) .......................... 2009 1 0018293

(51) Int. Cl.
    *H01L 33/36* (2010.01)
(52) U.S. Cl. ........... 257/99; 257/E33.025; 257/E33.051; 257/E33.066; 438/46
(58) Field of Classification Search ............... 257/99, 257/E33.025, E33.051, E33.062, E33.066; 438/46

See application file for complete search history.

(56) References Cited

U.S. PATENT DOCUMENTS

| | | | |
|---|---|---|---|
| 7,180,096 B2 * | 2/2007 | Wu et al. ........................... | 257/79 |
| 2006/0081857 A1 * | 4/2006 | Hong et al. ...................... | 257/84 |

OTHER PUBLICATIONS

Chang et al., "Improved ESD protection by combining InGaN-GaN MQW LEDs with GaN Schottky diodes," *IEEE Electron Device Letters*, 24:129-131, 2003.

* cited by examiner

*Primary Examiner* — Wensing Kuo
(74) *Attorney, Agent, or Firm* — Fulbright & Jaworski

(57) ABSTRACT

The invention provides an antistatic gallium nitride based light emitting device and a method for fabricating the same. The method includes: growing an n-type GaN-based epitaxial layer, an active layer, a p-type GaN-based epitaxial layer and an undoped GaN-based epitaxial layer sequentially on a substrate; etching to remove parts of the layers above, to expose a part of the n-type GaN-based epitaxial layer, with the unetched part defined as an emitting area; etching to remove a part of the undoped GaN-based epitaxial layer; forming an ohmic contact electrode on an exposed part of p-type GaN-based epitaxial layer, and forming a Schottky contact electrode on another part; forming a p-electrode on a transparent conducting layer such that the p-electrode is electrically connected with the ohmic contact electrode; forming an n-electrode on the exposed n-type GaN-based epitaxial layer; and forming a connecting conductor on an insulation layer such that the connecting conductor is electrically connected with the n-electrode and the Schottky contact electrode. By forming a GaN Schottky diode directly on a p-type GaN-based epitaxial layer, the fabrication process is simplified while providing antistatic ability at the same time, and the emitting area is made the maximum use of so as to avoid the drop in the luminous efficiency of the GaN-based LED.

7 Claims, 4 Drawing Sheets

ANTISTATIC GALLIUM NITRIDE BASED LIGHT EMITTING DEVICE AND METHOD FOR FABRICATING THE SAME

This application claims the benefit of Chinese patent application No. 200910018293.5 titled "Antistatic Gallium Nitride based Light Emitting Device and Method for Fabricating the Same", and filed with the Chinese Patent Office on Sep. 8, 2009, which is hereby incorporated by reference in its entirety.

FIELD OF THE INVENTION

The present invention relates to a gallium nitride based light emitting device and a method for fabricating the same, and in particular to an antistatic gallium nitride based light emitting device and a method for fabricating the same.

BACKGROUND OF THE INVENTION

As a revolutionary invention in the field of lighting in the 21$^{st}$ century, semiconductor lighting has gained a lot of attention from governments, scholars and related institutions worldwide. As for its current development, Gallium Nitride (GaN) based Light Emitting Diodes (LEDs) are the basis for realizing semiconductor lighting. As the technologies of epitaxial growth and chip process advance, internal quantum efficiency and extraction efficiency of GaN-based LEDs have been greatly improved, and luminous efficiency of lighting-class whites is now up to 161 lm/W. Although the luminous efficiency is relatively high, damages to the GaN-based LEDs due to electrostatics are still a serious problem in the application of the GaN-based LEDs. Currently, a common approach to protect a GaN-based LED from electrostatic damages is to connect it in parallel with a Zener diode during encapsulation; however, this would increase encapsulation complexity and manufacture costs. Consequently, a more advantageous approach is to integrate the GaN-based LED structure with an electrostatic protection diode structure in a light emitting device, so that the whole light emitting device is antistatic.

The document "S-J Chang, C-H Chen, Y-K Su, et al., *Improved ESD Protection by combining InGaN-GaN MQW LEDs with GaN Schottky diodes, IEEE Electron Device Letters*, Vol. 24, No. 3, pp 129-131, 2003" proposed a GaN-based light emitting device integrated with a Schottky diode. FIG. 1*a* illustrates a sectional view of its structure, and FIG. 1*b* illustrates an equivalent circuit. With reference to FIG. 1*a*, the light emitting device includes a GaN-based LED and a GaN Schottky diode. The GaN-based LED structure includes: a sapphire substrate 101; a buffer layer 102, a u-GaN layer 120, an n-GaN layer 103, a multi-quantum well active layer 104, a p-AlGaN barrier layer 105, a p-GaN layer 106 and a transparent conducting layer 111 formed in that order on the sapphire substrate 101; a p-electrode 112 on the transparent conducting layer 111; and, an n-electrode 113 on the exposed n-GaN layer 103. The GaN Schottky diode is formed in the GaN-based LED structure and is electrically isolated by a SiO$_2$ insulation layer 123 from the GaN-based LED structure except the transparent conducting layer 111, the p-electrode 112 and the n-electrode 113. The GaN Schottky diode structure includes: the sapphire substrate 101, the buffer layer 102 on the sapphire substrate 101, the u-GaN layer 120 on the buffer layer 102, an ohmic contact electrode 121 on a part of the u-GaN layer 120, and a Schottky contact electrode 122 on another part of the u-GaN layer 120. The ohmic contact electrode 121 is electrically connected with the p-electrode 112, and the Schottky contact electrode 122 is electrically connected with the n electrode 113. Therefore, the light emitting device is equivalently the GaN-based LED connected in parallel with the GaN Schottky diode, and the equivalent circuit is shown in FIG. 1*b*. As for the GaN-based LED, when a forward voltage is applied, almost all the current flows through the LED; and when an instantaneous backward electrostatic voltage is applied, it could be discharged through the GaN Schottky diode, i.e., most of the current flows through the Schottky diode, thereby reducing the damage to the GaN-based LED.

However, as the Schottky diode is formed in the LED structure, the conventional antistatic GaN-based light emitting device described above is of great fabrication difficulty and accuracy, and therefore is not suitable for mass production. In order to form the "built-in" Schottky diode, the epitaxial structure has to be etched to the u-GaN layer, which requires a thickened u-GaN layer (otherwise the processing window for etching may be too narrow); however, a thickened u-GaN layer means a cost increase. On the other hand, the presence of the "built-in" Schottky diode takes emitting areas, hence increasing current density of the active area and degrading the luminous efficiency. The case would be even worse while the size of the chip is small.

SUMMARY OF THE INVENTION

In order to solve the problems above, the present invention is to provide an antistatic GaN-based light emitting device and a method for fabricating the same. By forming a GaN Schottky diode directly on a p-type GaN-based epitaxial layer, the fabrication process is simplified while providing antistatic ability at the same time, and the emitting area is made the maximum use of so as to avoid the drop in the luminous efficiency of the GaN-based LED.

To achieve the object above, the present invention provides an antistatic GaN-based light emitting device, the structure of which including:

a substrate;

an n-type GaN-based epitaxial layer on the substrate, an active layer on the n-type GaN-based epitaxial layer, and a p-type GaN-based epitaxial layer on the active layer;

a GaN Schottky diode on a part of the p-type GaN-based epitaxial layer, the GaN Schottky diode including an undoped GaN-based epitaxial layer on said part of the p-type GaN-based epitaxial layer, an ohmic contact electrode on a part of the undoped GaN-based epitaxial layer and a Schottky contact electrode on another part of the undoped GaN-based epitaxial layer;

a transparent conducting layer on another part of the p-type GaN-based epitaxial layer;

an n-electrode on a part of the n-type GaN-based epitaxial layer;

a p-electrode on the transparent conducting layer and electrically connected with the ohmic contact electrode;

an insulation layer formed on side surfaces of the undoped GaN-based epitaxial layer, the p-type GaN-based epitaxial layer, the active layer and the n-type GaN-based epitaxial layer; and a connecting conductor on the insulation layer and another part of the n-type GaN-based epitaxial layer, and electrically connected with the Schottky contact electrode and the n-electrode.

A novel part of the device according to the present invention is that the GaN-based LED is integrated with the GaN Schottky diode in the same light emitting device, and the GaN Schottky diode is formed on a part of the p-type GaN-based epitaxial layer of the GaN-based LED; the GaN-based LED and the GaN Schottky diode are electrically connected in parallel with their polarities reversed, particularly, the ohmic contact electrode is electrically connected with the p-electrode, and the Schottky contact electrode is electrically connected with the n-electrode via the connecting conductor; and in order to avoid short circuits caused by the connecting conductor between the sidewalls of the epitaxial layers, the insulation layer is formed between the connecting conductor and the sidewall surfaces of the epitaxial layers for electrical isolation.

In the device according to the invention, the ohmic contact electrode is made of Ti, Al, or Cr, or any combination thereof; the Schottky contact electrode is made of Pt, Au, or Ni, or any combination thereof; the insulation layer is made of silicon dioxide, silicon nitride, titanium oxide, aluminum oxide or polyimide; and the connecting conductor is made of metal, metal alloy, metal oxide or semiconductor having good conductivity, or any combination thereof.

The present invention also provides a method for fabricating the antistatic GaN-based light emitting device above, including the steps of:

1) growing an n-type GaN-based epitaxial layer, an active layer, a p-type GaN-based epitaxial layer and an undoped GaN-based epitaxial layer on a substrate sequentially;

2) etching to remove parts of the undoped GaN-based epitaxial layer, the p-type GaN-based epitaxial layer, the active layer and the n-type GaN-based epitaxial layer, to expose a part of the n-type GaN-based epitaxial layer, with the unetched part defined as an emitting area;

3) etching to remove the undoped GaN-based epitaxial layer on a part of the emitting area, to expose a part of the p-type GaN-based epitaxial layer;

4) forming an ohmic contact electrode on a part of the undoped GaN-based epitaxial layer, and forming a Schottky contact electrode on another part of the undoped GaN-based epitaxial layer;

5) forming a transparent conducting layer on the exposed p-type GaN-based epitaxial layer;

6) forming a p-electrode on the transparent conducting layer such that the p-electrode is electrically connected with the ohmic contact electrode;

7) forming an n-electrode on the exposed n-type GaN-based epitaxial layer;

8) forming an insulation layer on a sidewall surface of the emitting area; and 9) forming a connecting conductor on the insulation layer such that the connecting conductor is electrically connected with the n-electrode and the Schottky contact electrode.

In the method above according to the present invention, in step 3) the undoped GaN-based epitaxial layer is etched using wet chemical etching; and in order to form the GaN Schottky diode on the p-type GaN-based epitaxial layer, the undoped GaN-based epitaxial layer is added with the present invention to the conventional epitaxial structure. In patterning of the undoped GaN-based epitaxial layer, selective etching of the undoped GaN-based epitaxial layer over the p-type GaN-based epitaxial layer is a serious issue. With dry etching, damages to the p-type GaN-based epitaxial layer would be hard to avoid and the contact resistance with the transparent conducting layer would be increased; therefore, the invention uses wet chemical etching to etch the undoped GaN-based epitaxial layer. In certain conditions, the p-type GaN-based epitaxial layer cannot be etched with wet chemical etching. Therefore, its surface characteristics can be well maintained, which is good for forming a good ohmic contact with the transparent conducting layer.

Advantageous effects brought by the present invention include: by forming a GaN Schottky diode directly on a p-type GaN-based epitaxial layer, the fabrication process is simplified while providing antistatic ability at the same time; manufacture costs are lowered; and the emitting area is made the maximum use of so as to avoid the drop in the luminous efficiency of the GaN-based LED, thereby solving the problem in the prior art that the conventional antistatic GaN-based light emitting device is complex in its fabrication process and has a degraded luminous efficiency.

Figure 1A:
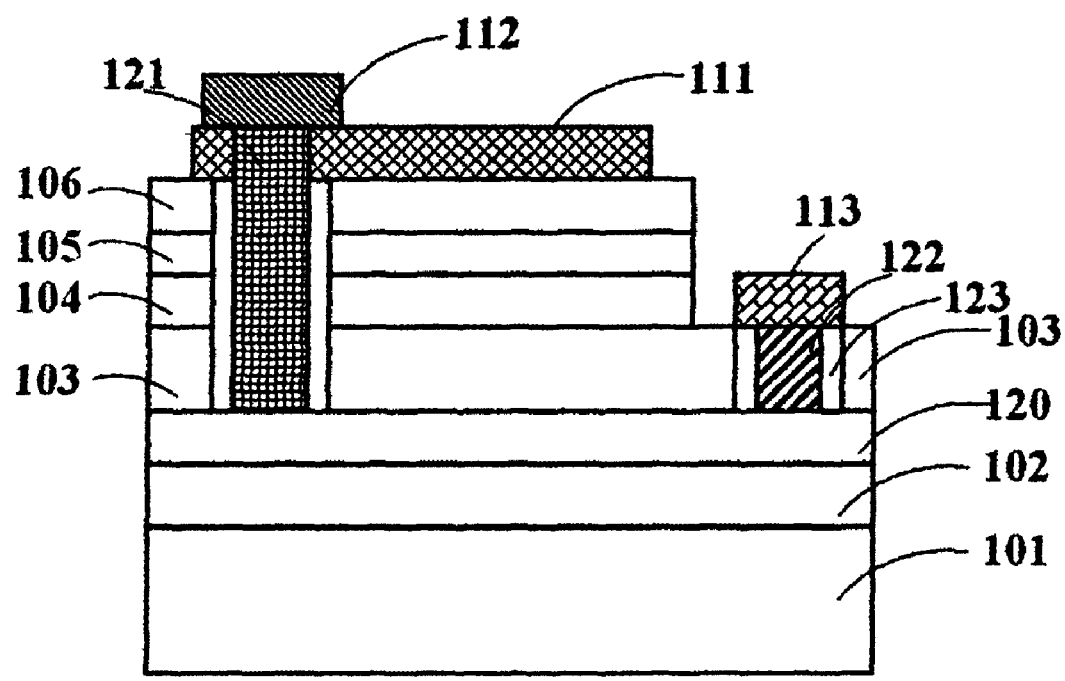
FIG. 1a is a sectional view of an existing antistatic GaN-based light emitting device.
Figure 1B:
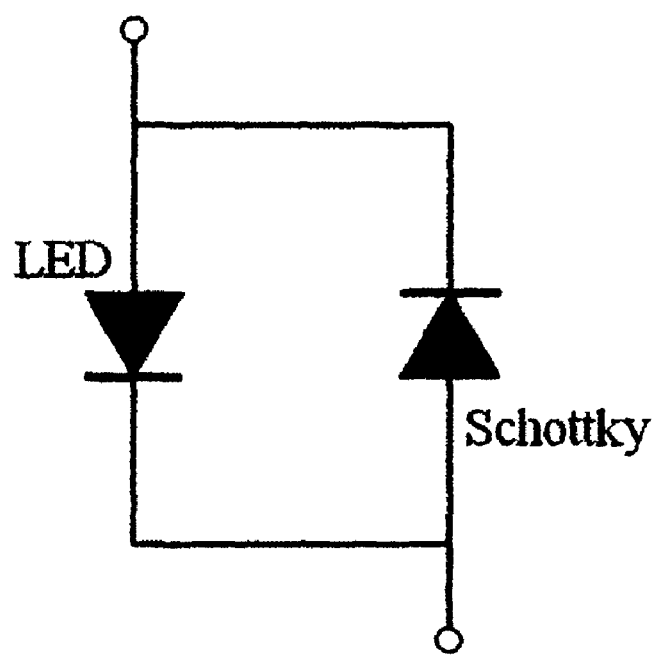
FIG. 1b illustrates an equivalent circuit of the existing antistatic GaN-based light emitting device.

Components in the drawings include:
101 Substrate
102 Buffer layer
103 n-GaN layer
104 Multi-quantum well active layer
105 p-AlGaN barrier layer
106 p-GaN layer
111 transparent conducting layer
112 p-electrode
113 n-electrode
120 u-GaN layer
121 ohmic contact electrode
122 Schottky contact electrode
123 $SiO_2$ insulation layer
124 connecting conductor

DETAILED DESCRIPTION OF THE INVENTION

The invention is further described hereinafter in connection with FIG. 2 and FIG. 3a to FIG. 3d and the preferred embodiments.

Figure 2:
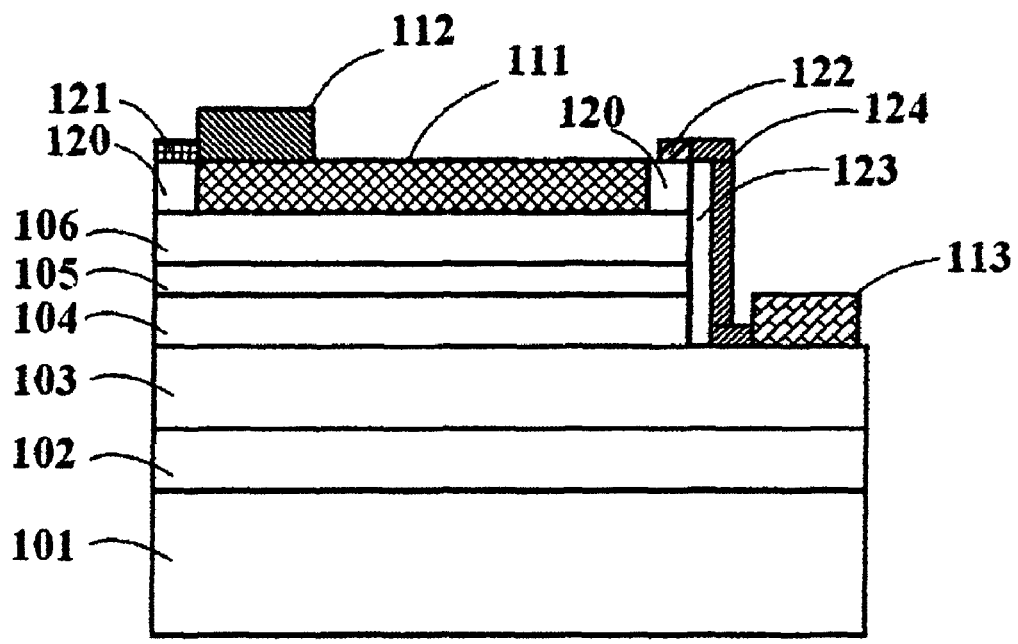
FIG. 2 is a sectional view of an antistatic GaN-based light emitting device according to an embodiment of the invention.

As shown in FIG. 2, a sectional view of an antistatic GaN-based light emitting device according to a preferred embodiment of the invention, it includes: a sapphire substrate 101, a buffer layer 102, an n-GaN layer 103, a multi-quantum well active layer 104, a p-AlGaN barrier layer 105, a p-GaN layer 106, an ITO transparent conducting layer 111, a p-electrode 112, an n-electrode 113, a u-GaN layer 120, an ohmic contact electrode 121, a Schottky contact electrode 122, an $SiO_2$ insulation layer 123 and a connecting conductor 124.

Particularly, the sapphire substrate 101, the buffer layer 102, the n-GaN layer 103, the multi-quantum well active layer 104, the p-AlGaN barrier layer 105, the p-GaN layer 106, the ITO transparent conducting layer 111, the p-electrode 112 and the n-electrode 113 form a GaN-based LED; and, the u-GaN layer 120, the ohmic contact electrode 121 and the Schottky contact electrode 122 form a GaN Schottky diode.

The structure of the GaN-based LED includes: the sapphire substrate 101 at the bottom; the buffer layer 102 formed on the sapphire substrate 101; the n-GaN layer 103 formed on the buffer layer 102; the multi-quantum well active layer 104 formed on the n-GaN layer 103; the p-AlGaN barrier layer 105 formed on the multi-quantum well active layer 104; the p-GaN layer 106 formed on the p-AlGaN barrier layer 105; the transparent conducting layer 111 formed on a part of the p-GaN layer 106 and made of Indium Tin Oxide (ITO); the p-electrode 112 formed on the transparent conducting layer 111 and made of Cr/Pt/Au; and, the n-electrode 113 formed on a part of the n-GaN layer 103 and made of Cr/Pt/Au.

The GaN Schottky diode is formed on a part of the p-GaN layer 106, and the structure of the GaN Schottky diode includes: the u-GaN layer 120 formed on a part of the p-GaN layer 106; the ohmic contact electrode 121 formed on a part of the u-GaN layer 120 and made of Ti/Al alloy; and, the Schottky contact electrode 122 formed on another part of the u-GaN layer 120 and made of Pt/Au.

The GaN-based light emitting device further includes the insulation layer 123 formed on the sidewall surface of the emitting area and made of SiO$_2$; and, the connecting conductor 124 formed on the insulation layer 123 and the n-GaN layer 103 and made of Pt/Au.

Particularly, the p-electrode 112 is electrically connected with the ohmic contact electrode 121, and the n-electrode 113 and the Schottky contact electrode 122 are electrically connected via the connecting conductor 123.

Figure 3A:
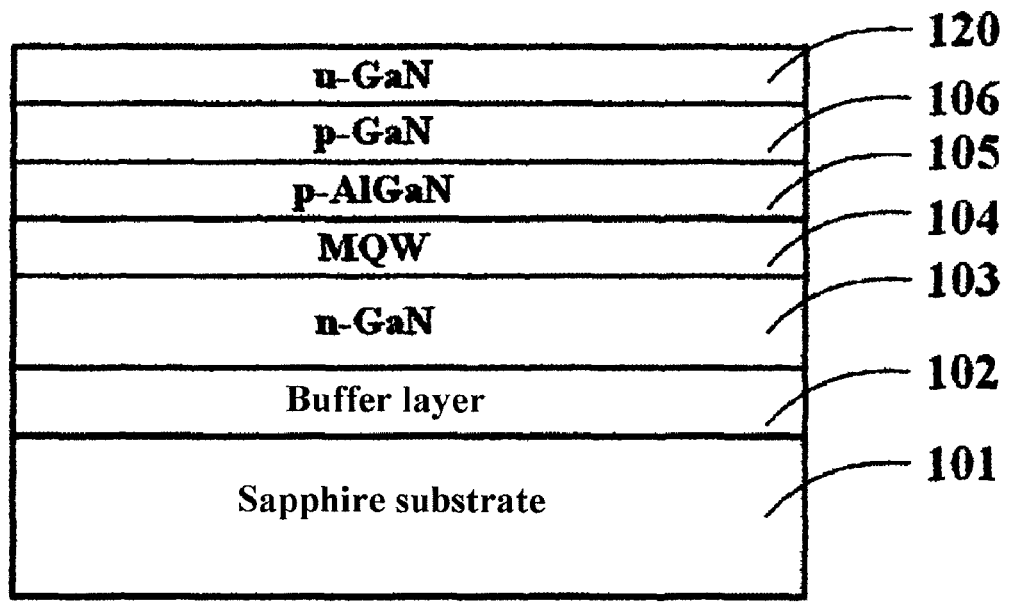
FIG. 3a to FIG. 3d are sectional views illustrating a fabrication process of an antistatic GaN-based light emitting device according the invention.

A method for fabricating the antistatic GaN-based light emitting device according to the preferred embodiment shown in FIG. 2 is described below:

As shown in FIG. 3a, with the sapphire substrate 101 being the substrate, the buffer layer 102, the n-GaN layer 103, the multi-quantum well active layer 104, the p-AlGaN barrier layer 105, the p-GaN layer 106 and the u-GaN layer 120 are grown on the sapphire substrate 101 sequentially using a Metalorganic chemical vapor deposition (MOCVD) method, to form a GaN-based LED epitaxial wafer.

Figure 3B:
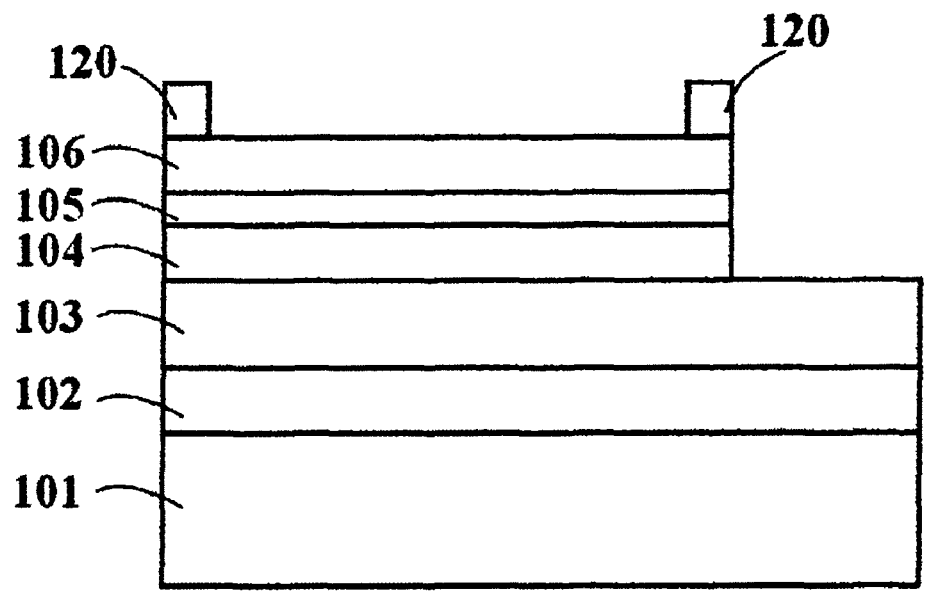

As shown in FIG. 3b, by using a photoresist as a mask and to define an emitting area, the u-GaN layer 120, the p-GaN layer 106, the p-AlGaN barrier layer 105 and the multi-quantum well active layer 104 outside the emitting area are removed using Inductively Coupled Plasma (ICP) dry etching, to expose the n-GaN layer 103. And by using a photoresist as a mask and to define the Schottky diode region, the u-GaN layer 120 on the emitting area except the Schottky diode region is removed using wet chemical etching, to expose the p-GaN layer 106. For maximum use of the emitting area, the Schottky diode region may be defined as surrounding the emitting area.

Figure 3C:
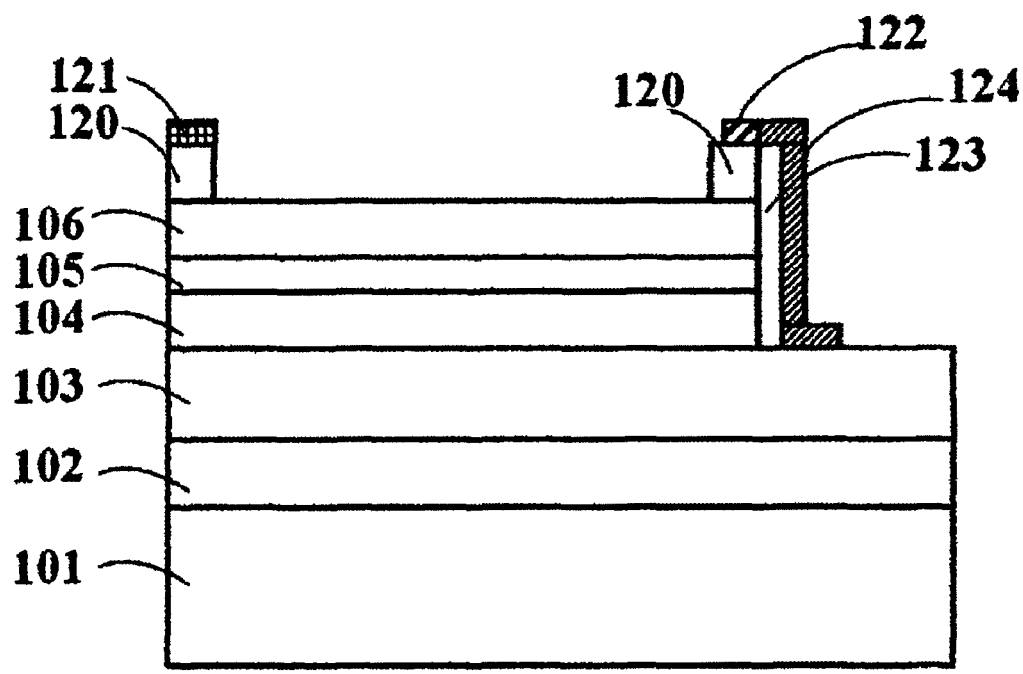

As shown in FIG. 3c, Ti/Al alloy is deposited on a part of the u-GaN layer 120 by evaporation, to form the ohmic contact electrode 121; Pt/Au is deposited on another part of the u-GaN layer 120 by evaporation, to form the Schottky contact electrode 122; the SiO$_2$ insulation layer 123 is deposited on the sidewall surface of the emitting area using a Chemical Vapor Deposition (CVD) method, the SiO$_2$ insulation layer 123 covering all or a part of the side surface of the emitting area; and, Pt/Au is deposited on the SiO$_2$ insulation layer 123 by evaporation as the connecting conductor 124, such that the connecting conductor 124 forms a good electrical connection with the Schottky contact electrode 122.

Figure 3D:
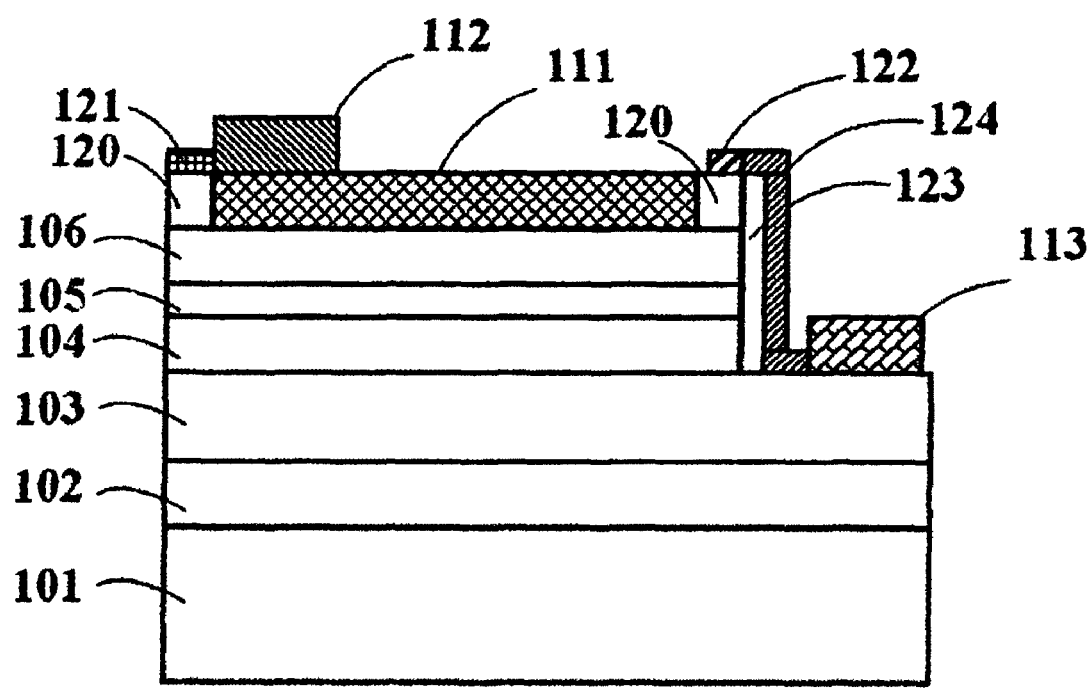

As shown in FIG. 3d, the ITO transparent conducting layer 111 is deposited on the p-GaN layer 106 by evaporation; Cr/Pt/Au is deposited on the ITO transparent conducting layer 111 by evaporation, to form the p-electrode 112 such that the p-electrode 112 is in a good electrical connection with the ohmic contact electrode 121; and, Cr/Pt/Au is deposited on the n-GaN layer 103 by evaporation, to form the n-electrode 113 such that the n-electrode 113 is in a good electrical connection with the connecting conductor 124.

As for electrostatic protection, the embodiments of the invention and the conventional antistatic GaN-based light emitting device shown in FIG. 1a both can protect the GaN-based LED from damages. However, as compared with the prior art, the structure of the embodiments of the invention is simpler and easier to make, and makes maximum use of the emitting area, maintaining the original luminous efficiency of the LED.

The invention claimed is:

1. An antistatic Gallium Nitride, GaN, based light emitting device, comprising:
   a substrate;
   an n-type GaN-based epitaxial layer formed on the substrate, an active layer formed on the n-type GaN-based epitaxial layer, and a p-type GaN-based epitaxial layer formed on the active layer;
   a GaN Schottky diode on a part of the p-type GaN-based epitaxial layer, the GaN Schottky diode comprising an undoped GaN-based epitaxial layer on said part of the p-type GaN-based epitaxial layer, an ohmic contact electrode on a part of the undoped GaN-based epitaxial layer and a Schottky contact electrode on another part of the undoped GaN-based epitaxial layer;
   a transparent conducting layer on another part of the p-type GaN-based epitaxial layer;
   an n-electrode on a part of the n-type GaN-based epitaxial layer;
   a p-electrode on the transparent conducting layer and electrically connected with the ohmic contact electrode;
   an insulation layer formed on side surfaces of the undoped GaN-based epitaxial layer, the p-type GaN-based epitaxial layer, the active layer and the n-type GaN-based epitaxial layer; and
   a connecting conductor on the insulation layer and another part of the n-type GaN-based epitaxial layer, and electrically connected with the Schottky contact electrode and the n-electrode.

2. The antistatic GaN-based light emitting device according to claim 1, wherein: the ohmic contact electrode is made of Ti, or Al, or Cr, or any combination thereof.

3. The antistatic GaN-based light emitting device according to claim 1, wherein: the Schottky contact electrode is made of Pt, or Au, or Ni, or any combination thereof.

4. The antistatic GaN-based light emitting device according to claim 1, wherein: the insulation layer is made of silicon dioxide, silicon nitride, titanium oxide, aluminum oxide or polyimide.

5. The antistatic GaN-based light emitting device according to claim 1, wherein: the connecting conductor is made of metal, metal alloy, metal oxide, or semiconductor having good conductivity, or any combination thereof.

6. A method for fabricating an antistatic Gallium Nitride, GaN, based light emitting device, comprising:
   1) growing an n-type GaN-based epitaxial layer, an active layer, a p-type GaN-based epitaxial layer and an undoped GaN-based epitaxial layer on a substrate sequentially;
   2) etching to remove parts of the undoped GaN-based epitaxial layer, the p-type GaN-based epitaxial layer, the active layer and the n-type GaN-based epitaxial layer, to expose a part of the n-type GaN-based epitaxial layer, with the unetched part defined as an emitting area;
   3) etching to remove the undoped GaN-based epitaxial layer on a part of the emitting area, to expose a part of the p-type GaN-based epitaxial layer;
   4) forming an ohmic contact electrode on a part of the undoped GaN-based epitaxial layer, and forming a Schottky contact electrode on another part of the undoped GaN-based epitaxial layer;

5) forming a transparent conducting layer on the exposed p-type GaN-based epitaxial layer;
6) forming a p-electrode on the transparent conducting layer such that the p-electrode is electrically connected with the ohmic contact electrode;
7) forming an n-electrode on the exposed n-type GaN-based epitaxial layer;
8) forming an insulation layer on a sidewall surface of the emitting area; and
9) forming a connecting conductor on the insulation layer such that the connecting conductor is electrically connected with the n-electrode and the Schottky contact electrode.

7. The method for fabricating an antistatic GaN-based light emitting device according to claim 6, wherein: in step 3) the undoped GaN-based epitaxial layer is etched using wet chemical etching.

* * * * *